US006555869B2

(12) United States Patent
Park

(10) Patent No.: US 6,555,869 B2
(45) Date of Patent: Apr. 29, 2003

(54) NON-VOLATILE MEMORY DEVICE AND METHOD OF MANUFACTURING THE SAME

(75) Inventor: Weon-Ho Park, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/056,478

(22) Filed: Jan. 24, 2002

(65) Prior Publication Data

US 2002/0105020 A1 Aug. 8, 2002

(30) Foreign Application Priority Data

Feb. 8, 2001 (KR) .......................................... 2001-6215
Sep. 10, 2001 (KR) ........................................ 2001-55593

(51) Int. Cl.[7] ............................................ H01L 29/788
(52) U.S. Cl. ........................ 257/315; 257/314; 257/318
(58) Field of Search .................................. 257/295, 298, 257/314–326; 438/3, 201, 211, 257–266, 216, 591–594

(56) References Cited

U.S. PATENT DOCUMENTS 5,063,423 A * 11/1991 Fujii et al. ................... 257/316
5,877,980 A * 3/1999 Mang et al. ................. 257/319
2001/0054735 A1 * 12/2001 Nagai .......................... 257/314

* cited by examiner

*Primary Examiner*—David Nelms
*Assistant Examiner*—Long Tran
(74) *Attorney, Agent, or Firm*—Mills & Onello LLP

(57) ABSTRACT

A non-volatile memory device includes gate insulating films formed on a semiconductor substrate and spaced apart from each other. A tunnel insulating film is formed on the semiconductor substrate and interposed between the adjacent gate insulating films. A memory transistor gate is formed on the tunnel insulating film and the gate insulating film interposing the tunnel insulating film therebetween. A select transistor gate is formed on the gate insulating film spaced apart from the memory transistor gate. A first doped region is formed in a portion of the semiconductor substrate under the memory transistor gate and extending to overlap one end of the select transistor gate. A second doped region is formed in a portion of the semiconductor substrate spaced apart from the first doped region and overlapping one end of the memory transistor opposite to the select transistor gate. A third doped region is formed in a portion of the semiconductor substrate spaced apart from the first doped region and overlapping the other end of the select transistor gate. The second doped region has a low-density doped region and a high-density doped region and is shallower in depth than the first and third doped regions.

9 Claims, 11 Drawing Sheets

NON-VOLATILE MEMORY DEVICE AND METHOD OF MANUFACTURING THE SAME

CROSS REFERENCE

This application claims the benefit of Korean Patent Application No. 2001-6215, filed on Feb. 8, 2001, and the benefit of Korean Patent Application No. 2001-55593, filed on Sep. 10, 2001, under 35 U.S.C. §119, the entirety of which are hereby incorporated by reference.

BACKGROUND OF THE INVENTION

1. Field of the Invention

The present invention relates to a non-volatile memory device, and more particularly, to an EEPROM cell and a method of manufacturing the same.

2. Description of Related Art

An electrically erasable programmable read only memory (EEPROM) is a device in which electrons move through a tunnel oxide film made of a thin insulating layer such as $SiO_2$ by a Fowler-Nordheim (FN) tunneling phenomenon so that charges are stored in a floating gate, and a transistor is turned on or off according to an amount of charge accumulated in the floating gate. Whether the transistor is turned on or off depends on the magnitude of a threshold voltage of the device.

The EEPROM has become smaller in unit cell size as memory capacity has increased. If the size of a unit cell is reduced in order to satisfy this memory capacity requirement, there occurs a problem in that memory cell characteristics tend to deteriorate.

FIG. 1 is a cross-sectional view illustrating a floating gate tunnel oxide (FLOTOX) type of EEPROM cell according to conventional art. The EEPROM cell includes a semiconductor substrate 10. Even though not shown in FIG. 1, the semiconductor substrate 10 includes an active region and a field region. A tunnel insulating film 15 is formed on the active region of the semiconductor substrate 10 to a relatively thin thickness. A gate insulating film 17 is formed on a remaining portion of the active region of the semiconductor substrate 10 to a thickness thicker than the tunnel insulating film 15, except at a portion of the active region of the semiconductor substrate 10 on which the tunnel insulating film 15 is formed.

A floating gate 21, an interlayer insulator 22 and a sense line 23 are stacked on the tunnel insulating film 15 and the gate insulating films 17 interposing the tunnel insulating film 15 therebetween in the above-described order. The floating gate 21, the interlayer insulator 22 and the sense line 23 form a gate of a memory transistor 20. A word line 25 is formed on the gate insulating film 17 spaced apart from the memory transistor 20 to form a gate of a select transistor 30.

Spacers 18 are formed on both side walls of the floating gate 21 and the sense line 23 and on both side walls of the word line 25.

A channel region 40 is formed in a portion of the semiconductor substrate 10 under the tunnel insulating film 15 to overlap the word line 25. The channel region 40 includes an $n^+$-type high-density doped region 31 and an $n^{31}$-type low-density doped region 35. At this point, the high-density doped region is referred to as a region having a relatively high impurity concentration, and the low-density doped region is referred to as a region having a relatively low impurity concentration.

A common source region 50 is formed in a portion of the semiconductor substrate 10 spaced apart from the channel region 40 to overlap the floating gate 21 of the memory transistor 20. The common source region 50 has a double diffusion structure of an $n^+$-type high-density doped region 32 and an $n^-$-type low-density doped region 36.

A drain region 60 is formed in a portion of the semiconductor substrate 10 spaced apart from the channel region 40 to overlap the word line 25. The drain region 60 has a double diffusion structure of an $n^+$-type high-density doped region 33 and an $n^-$-type low-density doped region 37.

In the conventional EEPROM cell of FIG. 1, the common source region 50 and the drain region 60 which have such a double diffusion structure are formed in accordance with the following. The $n^-$-type low-density doped region 35, the $n^-$-type low-density doped region 36 and the $n^-$-type low-density doped region 37 are simultaneously formed to the same depth after the $n^+$-type high-density doped region 31 is formed. Thereafter, the $n^+$-type high-density doped regions 32 and 33 are formed within the $n^-$-type low-density doped regions 36 and 37, respectively, to a depth thinner than the $n^-$-type low-density doped regions 36 and 37.

Therefore, since the $n^-$-type low-density doped region 35 of the channel region 40, the $n^-$-type low-density doped region 36 of the common source region 50 and the $n^-$-type low-density doped region 37 of the drain region 60 are simultaneously formed to the same depth, the $n^-$-type low-density doped region 36 of the common source region 50 extends toward the channel region 40 by a side diffusion. As a result, there is a problem in that a distance margin between the $n^-$-type low-density doped region 36 and the channel region 40 becomes shortened.

As the size of the EEPROM cell is reduced, this problem becomes more serious, and an effective channel length is shortened, leading to a short channel effect. As a result, when a strong electric field is applied between the source region 50 and the drain region 60, a drift current occurs. Such a drift current results in a leakage current, and the threshold voltage distribution becomes bad due to the leakage current. That is, the threshold voltage is varied, whereupon characteristics of the device deteriorate.

SUMMARY OF THE INVENTION

To overcome the problems described above, preferred embodiments of the present invention provide a non-volatile memory having an improved threshold voltage dispersion and excellent device characteristics.

The present invention is directed to a non-volatile memory device which includes gate insulating films formed on a semiconductor substrate and spaced apart from each other and a tunnel insulating film formed on the semiconductor substrate and interposed between the adjacent gate insulating films. A memory transistor gate is formed on the tunnel insulating film and the gate insulating film interposing the tunnel insulating film therebetween. A select transistor gate is formed on the gate insulating film spaced apart from the memory transistor gate. A first doped region is formed in a portion of the semiconductor substrate under the memory transistor gate and extending to overlap one end of the select transistor gate. A second doped region is formed in a portion of the semiconductor substrate spaced apart from the first doped region and overlapping one end of the memory transistor opposite to the select transistor gate. A third doped region is formed in a portion of the semiconductor substrate spaced apart from the first doped region and overlapping the other end of the select transistor gate. The second doped region has a low-density doped region and a high-density doped region and is shallower in depth than the first and third doped regions.

In various preferred embodiments of the invention, the low-density doped region and the high-density doped region of the second doped region form a lightly doped drain (LDD) structure. The third doped region has a low-density doped region and a high-density doped region and has a double diffusion structure. The memory transistor gate includes a floating gate, an interlayer insulator and a sense line which are stacked in sequence. The floating gate includes polysilicon, the interlayer insulator includes $SiO_2$ or oxide/nitride/oxide, and the sense line includes polysilicon or polycide. The select transistor gate includes a floating gate, an interlayer insulator and a word line which are stacked in sequence. The tunnel insulating film includes $SiO_2$ or SiON. The first to third doped regions include an $n^-$-type low-density doped region and an $n^+$-type low-density doped region.

The present invention further provides a method of manufacturing a non-volatile memory device. The method of the invention includes: a) providing a semiconductor substrate including gate insulating films, a tunnel insulating film and a first high-density doped region, the gate insulating films being spaced apart from each other, the tunnel insulating film being interposed between the adjacent gate insulating films, the first high-density doped region being formed in a portion of the semiconductor substrate under the tunnel insulating film; b) forming a memory transistor gate and a select transistor gate, the memory transistor gate being formed on the tunnel insulating film and the gate insulating films interposing the tunnel insulating film therebtween, the select transistor gate being formed on the gate insulating film spaced apart from the memory transistor gate; c) forming a first low-density doped region and a second low-density doped region in a channel region, the first low-density doped region abutting the first high-density doped region and extending to overlap one end of the select transistor gate, the second low-density doped region being spaced apart from the first low-density doped region and overlapping the other end of the select transistor gate; d) forming a third low-density doped region, the third low-density doped region being spaced apart from the first high-density doped region and overlapping one end of the memory transistor gate opposite to the select transistor gate; and e) forming a second high-density doped region in a common source region and a third high-density doped region in a drain region, the second high-density doped region being formed in the second low-density doped region, the third high-density region abutting on the third low-density doped region.

In various preferred embodiments of the invention, step (b) includes depositing a first conductive material layer and an interlayer insulator in sequence over the whole surface of the semiconductor substrate; etching simultaneously the first conductive material layer and the interlayer insulator to form a floating gate of the memory transistor gate and a floating gate of the select transistor gate; oxidizing the floating gate to form oxide film on both side walls of the floating gate; depositing a second conductive material layer over the whole surface of the semiconductor substrate; and etching the second conductive material layer to form a sense line of the memory transistor gate and a word line of the select transistor gate.

Step (b) can also include depositing a first conductive material layer and an interlayer insulator in sequence over the whole surface of the semiconductor substrate; etching simultaneously the first conductive material layer and the interlayer insulator to form a floating gate of the memory transistor gate; oxidizing the floating gate to form an oxide film on both side walls of the floating gate; depositing a second conductive material layer over the whole surface of the semiconductor substrate; and etching the second conductive material layer to form a sense line of the memory transistor gate and a word line of the select transistor gate.

The first conductive material layer can includes polysilicon, the interlayer insulator can include $SiO_2$ or ONO, and the second conductive material layer can include polysilicon or polycide. The tunnel insulating film can include $SiO_2$ or SiON.

The first high-density doped region can be formed by ion-implanting a phosphorus ion or an arsenic ion at an accelerating voltage of 40 keV to 100 keV and at a dose of $1.0 \times 10^{13}$ atom/cm$^2$ to $1.0 \times 10^{14}$ atom/cm$^2$. The second and third high-density doped regions can be formed by ion-implanting an arsenic ion at an accelerating voltage of 40 keV to 60 keV and at a dose of $1.0 \times 10^{15}$ atom/cm$^2$ to $5.0 \times 10^{15}$ atom/cm$^2$. The first and second low-density doped regions can be formed by ion-implanting a phosphorus ion at an accelerating voltage of 80 keV to 90 keV and at a dose of $1.0 \times 10^{12}$ atom/cm$^2$ to $5.0 \times 10^{13}$ atom/cm$^2$. The third low-density doped region can be formed by ion-implanting a phosphorus ion or an arsenic ion at an accelerating voltage of 30 keV to 80 keV and at a dose of $1.0 \times 10^{12}$ atom/cm$^2$ to $1.0 \times 10^{13}$ atom/cm$^2$.

In one embodiment, the method of the invention further comprises, before step (e), depositing an insulating material layer over the whole surface of the semiconductor substrate and etching anisotropically the insulating material layer to from spacers on both side walls of the oxide films. The method can also include, before step (e), depositing an insulating material layer over the whole surface of the semiconductor substrate and etching anisotropically the insulating material layer to form spacers on both side walls of the oxide film.

The EEPROM cell according to the present invention has several advantages. For example, since the low-density doped region of the common source region is formed by a separate process from the low-density doped regions of the channel region and the drain region in a depth shallower than the low-density doped regions of the channel region and the drain region, a side diffusion of the common source region can be reduced. Therefore, an effective channel length of the memory transistor is increased without increasing a size of the EEPROM cell, thereby improving threshold voltage distribution, leading to excellent device characteristics.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 2:
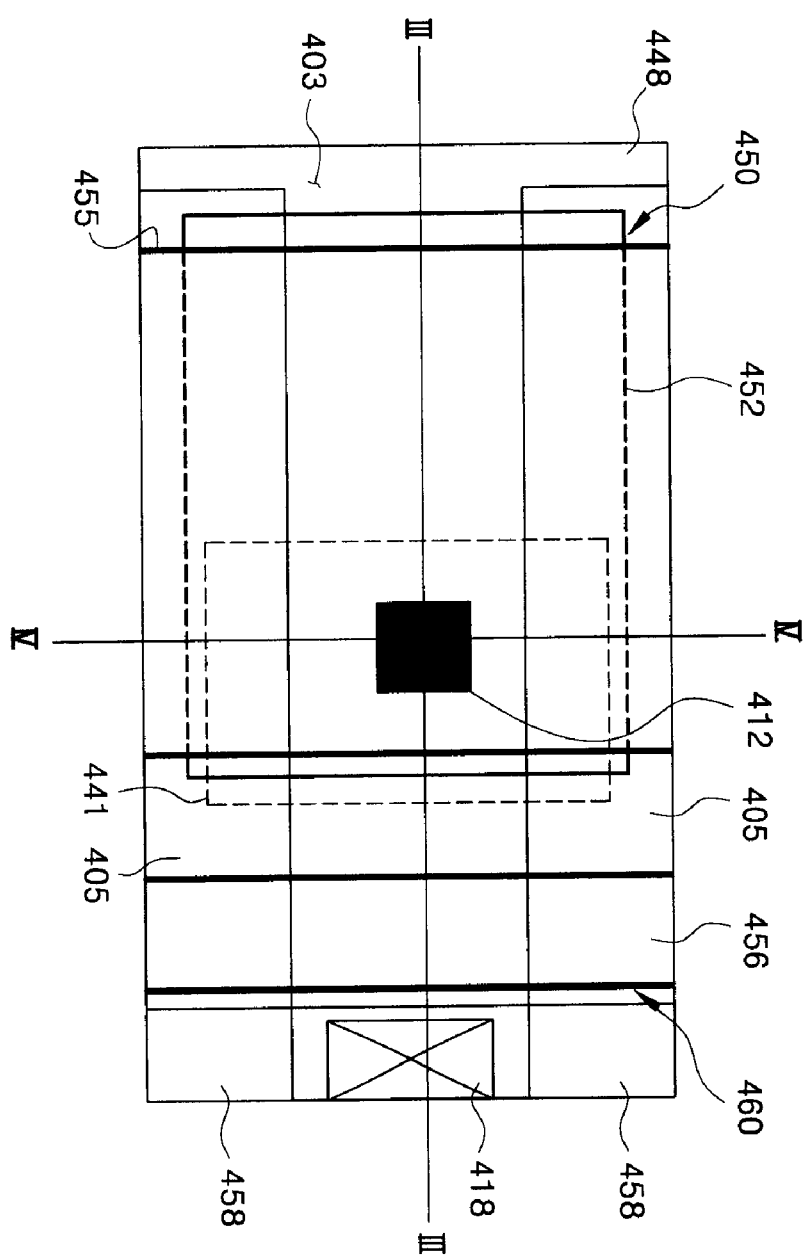
FIG. 2 is a layout view illustrating an EEPROM cell according to an embodiment of the present invention.
Figure 3:
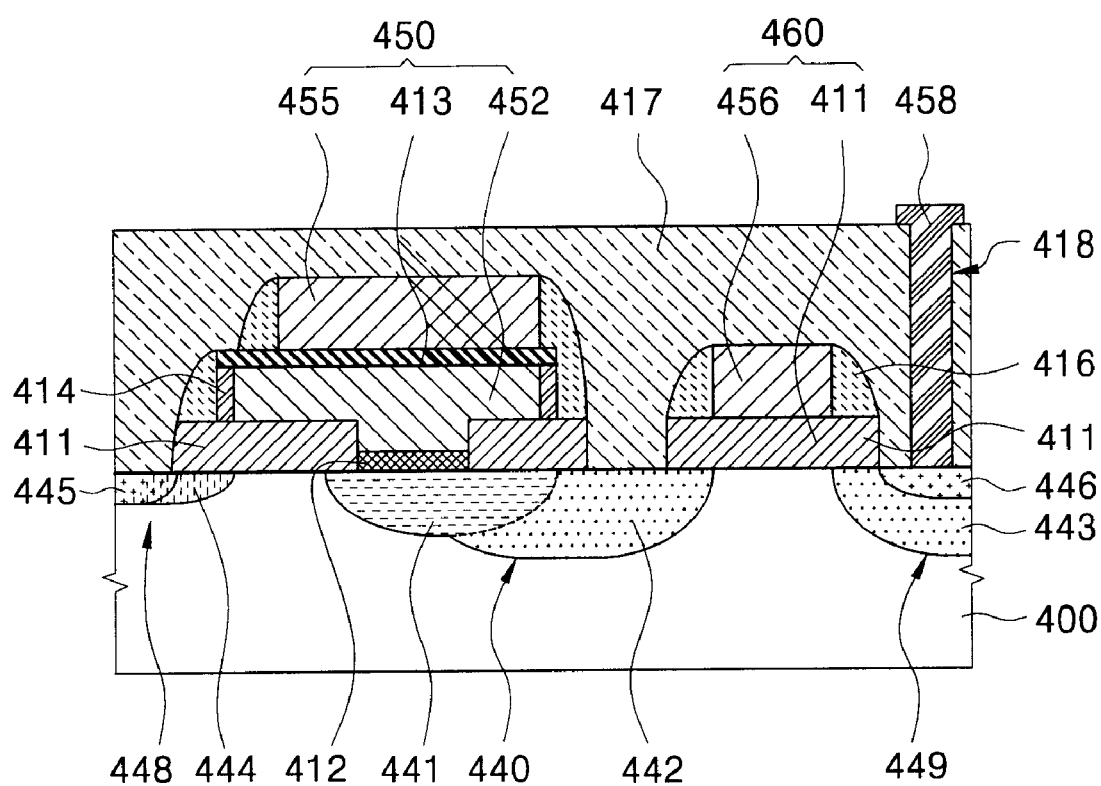
FIG. 3 is a cross-sectional view taken along line III—III of FIG. 2.
Figure 4:
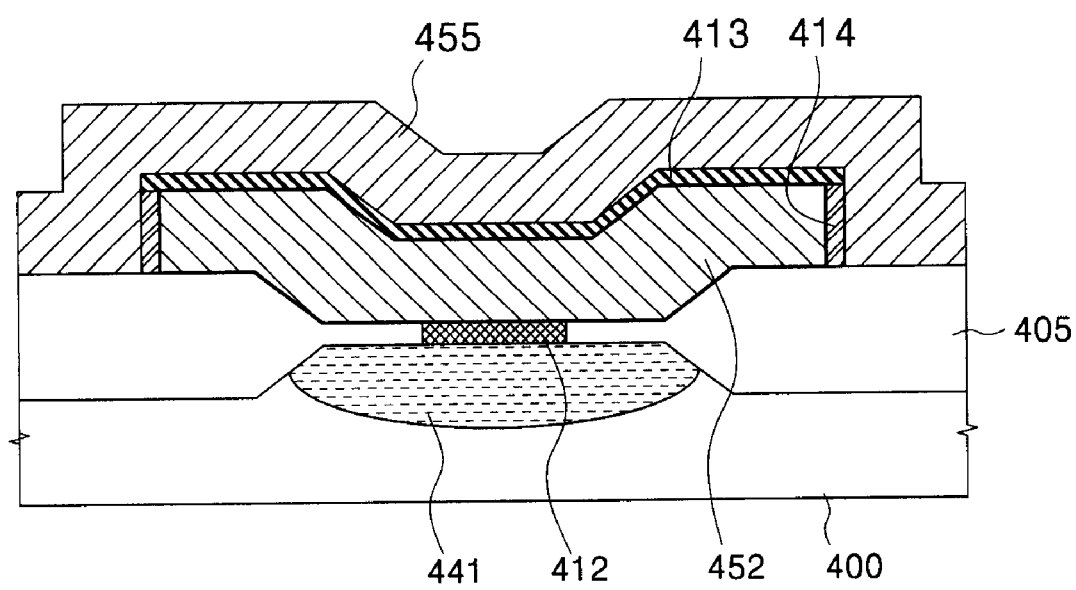
FIG. 4 is a cross-sectional view taken along line IV—IV of FIG. 2.

FIG. 2 is a layout view illustrating an EEPROM cell according to an embodiment of the present invention. FIG. 3 is a cross-sectional view taken along line III—III of FIG. 2, and FIG. 4 is a cross-sectional view taken along line IV—IV of FIG. 2. A structure of the EEPROM cell is described below with reference to FIGS. 2 to 4.

A semiconductor substrate 400 includes an active region 403 and a field region 405. A tunnel insulting film 412 is formed on a portion of the active region 403 of the semiconductor substrate 400 to a relatively thin thickness. The tunnel insulating film 412 is preferably made of $SiO_2$ or SiON. A gate insulating film 411 is formed on the remaining portion of the active region 403 to a relatively thick thickness except at the portion of the active region 403 on which the tunnel insulating film 412 is formed.

A floating gate 452, an interlayer insulator 413 and a sense line 455 are stacked on the tunnel insulating film 412 and the gate insulating films 411 interposing the tunnel insulating film 412 therebetween in the above-described order. The floating gate 452, the interlayer insulator 413 and the sense line 455 form a gate 450 of a memory transistor. A word line 456 is formed on the gate insulating film 411 spaced apart from the gate 450 of the memory transistor to form a gate 460 of a select transistor.

Preferably, the floating gate 452 is made of polysilicon, and the sense line 455 and the word line 456 are made of polysilicon or polycide. Preferably, the interlayer insulator 413 is made of $SiO_2$ or oxide/nitride/oxide (O/N/O).

The semiconductor substrate 400 includes three junction regions: channel region 440; common source region 448; and drain region 449. The channel region 440 is formed in a portion of the semiconductor substrate 400 under the tunnel insulating film 412 to overlap the word line 456 of the select transistor. The channel region 440 includes an n$^+$-type high-density doped region 441 and an n$^-$-type low-density doped region 442.

The common source region 448 is formed in a portion of the semiconductor substrate 400 spaced apart from the channel region 440 to overlap the floating gate 452 of the memory transistor. The common source region 448 has a lightly doped drain (LDD) structure of an n$^-$-type low-density doped region 444 and an n$^+$-type high-density doped region 445.

The drain region 449 is formed in a portion of the semiconductor substrate 400 spaced apart from the channel region 440 to overlap the word line 456 of the select transistor. The drain region 449 has a double diffusion structure of an n$^-$-type low-density doped region 443 and an n$^+$-type high-density doped region 446.

An oxide film 414 is formed on both side walls of the floating gate 452. Spacers 416 are formed on both side walls of the oxide film 414 and the sense line 455 of the memory transistor and on both side walls of the word line 456 of the select transistor.

A passivation film 417 is formed over the whole surface of the semiconductor substrate 400. The passivation film 417 includes a contact hole 418 that exposes a portion of the n$^+$-type high-density doped region 446 of the drain region 449. A bit line 458 is formed to electrically contact the drain region 449 through the contact hole 418.

In the EEPROM cell according to a preferred embodiment of the present invention, the n$^-$-type low-density doped region 444 of the common source region 448 is shallower in depth than the n$^-$-type low-density doped region 442 of the channel region 440 and the n$^-$-type low-density doped region 443 of the drain region 449.

Figure 1:
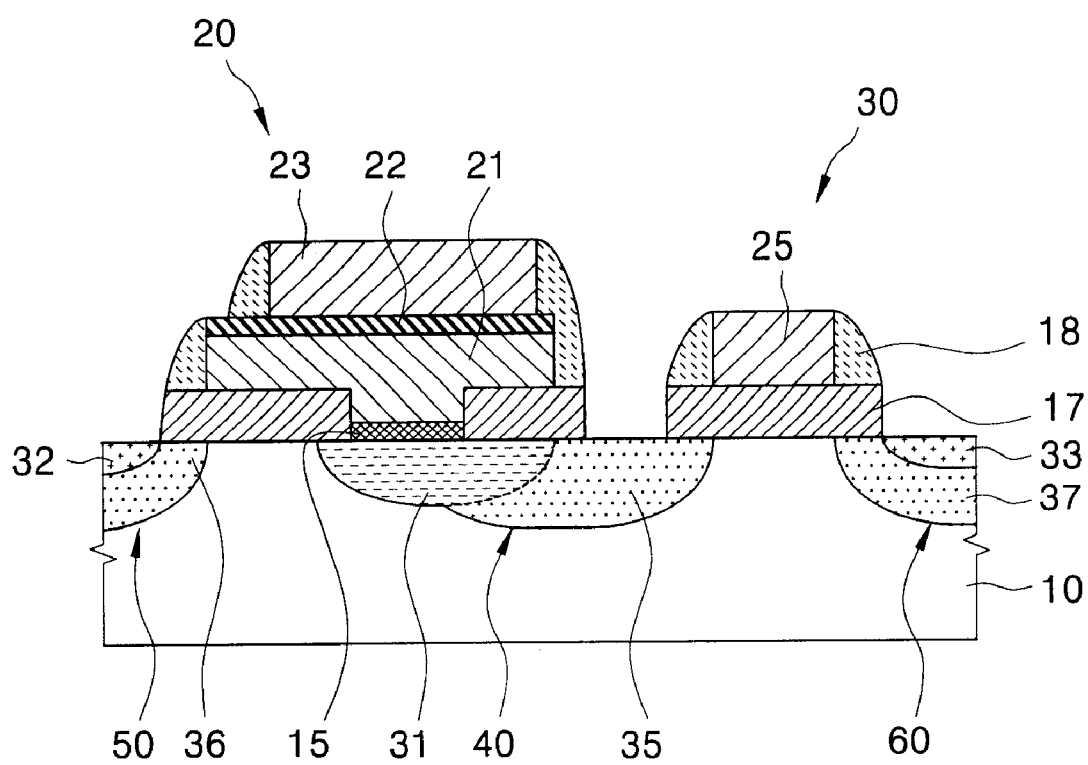
FIG. 1 is a cross-sectional view illustrating a floating gate tunnel oxide (FLOTOX) type of EEPROM cell according to conventional art.

Therefore, The n$^-$-type low-density doped region 444 of the common source region 448 expands toward the channel region 440 less than the n$^-$-type low-density doped region 36 of the common source region 50 of FIG. 1. The n$^-$-type low-density doped region 444 of the common source region 448 expands toward channel region 440 by approximately 0.3 μm, whereas the n$^-$-type low-density doped region 36 of the common source region 50 of FIG. 1 expands toward the channel region 40 by 0.5 μm. In other words, the n$^-$-type low-density doped region 444 of FIG. 3 is shorter in side diffusion length than n$^-$-type low-density doped region 36 of FIG. 1.

As a result, an effective channel length of the EEPROM cell can be increased without increasing a unit cell size, thereby improving a threshold voltage of the EEPROM cell.

Figure 5:
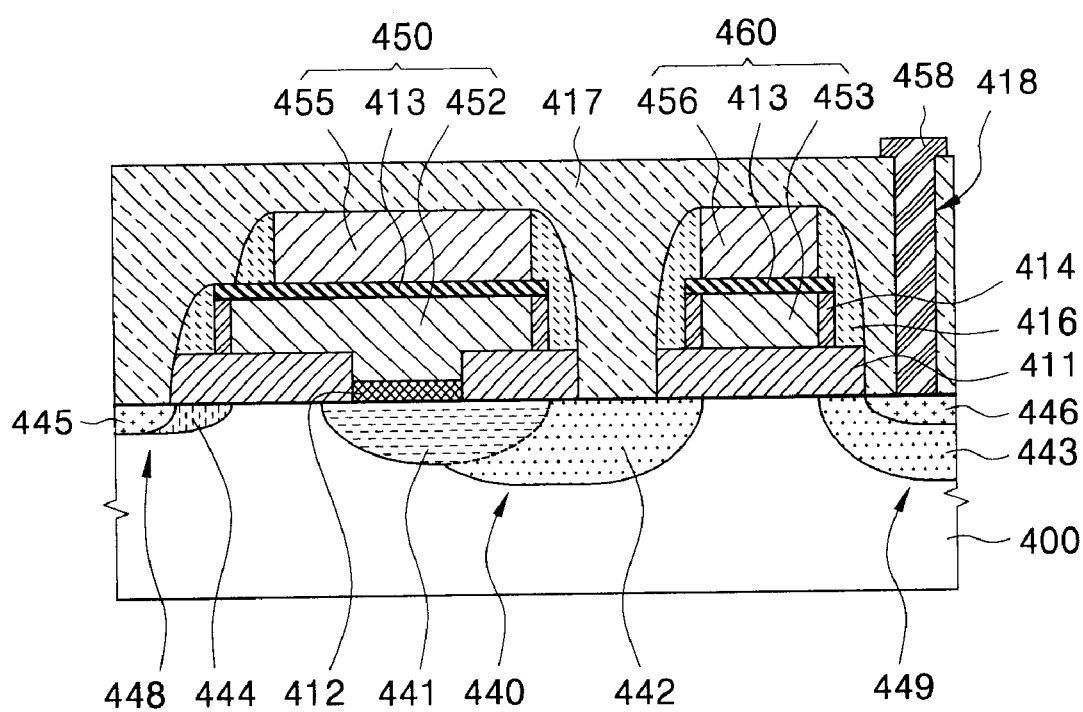
FIG. 5 is a cross-sectional view illustrating the EEPROM cell according to another embodiment of the present invention.

FIG. 5 is a cross-sectional view illustrating the EEPROM cell according to another embodiment of the present invention. The EEPROM cells of FIGS. 3 and 5 have almost the same configuration and differ in structure of a gate of the select transistor. A gate 460 of the select transistor of FIG. 5 includes a floating gate 453, an interlayer insulator 413 and a word line 456 which are stacked on the gate insulating film 411 in the above-described order. The oxide film 414 is formed on both side walls of the floating gate 453. The spacers 416 are formed on both side walls of the oxide film 414 and both side walls of the word line 456.

An erase operation of the EEPROM cell according to the present invention is performed according to the following. A high voltage of 15 volts to 20 volts is applied to the sense line 455 of the gate 450 of the memory transistor. A voltage of 0 volts is applied to the bit line 458 which is electrically connected to the drain region 449. A voltage of 0 volts is applied to the common source region 448, or the common source region 448 is left in a floating state. A high voltage of 15 volts to 20 volts is applied to the word line 456 of the gate 460 of the select transistor. As a result, a strong electric field is formed between the bit line 458 and the sense line 455 of the gate 450 of the memory transistor, and electrons move to the floating gate 452 through the tunnel insulating film 412 by the FN tunneling phenomenon. Consequently, electrons are accumulated in the floating gate 452 of the gate 450 of the memory transistor, so that a threshold voltage of the memory transistor is increased by about 3 volts to 7 volts. Therefore, an erase operation of the EEPROM cell is completed.

A program operation of the EEPROM cell according to the present invention is performed according to the following. A voltage of 0 volts is applied to the sense line 455 of the gate 450 of the memory transistor, and a high voltage of 15 volts to 20 volts is applied to the bit line 458 which is electrically connected to the drain region 449. The common source region 448 is left in a floating state. A high voltage of 15 volts to 20 volts is applied to the word line 456 of the gate 460 of the select transistor. As a result, electrons accumulated in the floating gate 452 of the gate 450 of the memory transistor are discharged. Consequently, a threshold voltage of the memory transistor is dropped to −4 volts to 0 volts. Therefore, a program operation of the EEPROM cell is completed.

Data programmed in the memory transistor is read in such a manner that a predetermined voltage is applied to the bit line and the sense line of a selected cell among a plurality of the EEPROM cells, and it is determined whether a current flows through the memory transistor.

FIGS. 6A to 6L are cross-sectional view illustrating a process of manufacturing the EEPROM cell of FIG. 5.

Figure 6A:
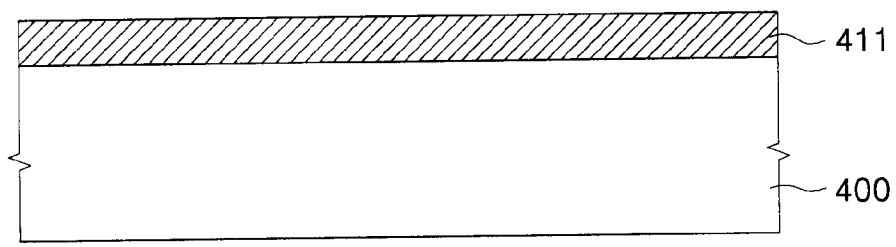
FIGS. 6A to 6L are cross-sectional views illustrating a process of manufacturing the EEPROM cell of FIG. 5.

Referring to FIG. 6A, the gate insulating film 411 is formed on the whole surface of the semiconductor substrate 400. The gate insulating film 411 is preferably made of $SiO_2$ and has a thickness of 300 Å to 500 Å. Even though not shown, a field insulating film is formed on the field region of the semiconductor substrate 400 to isolate adjacent elements before the gate insulating film 411 is formed.

Figure 6B:
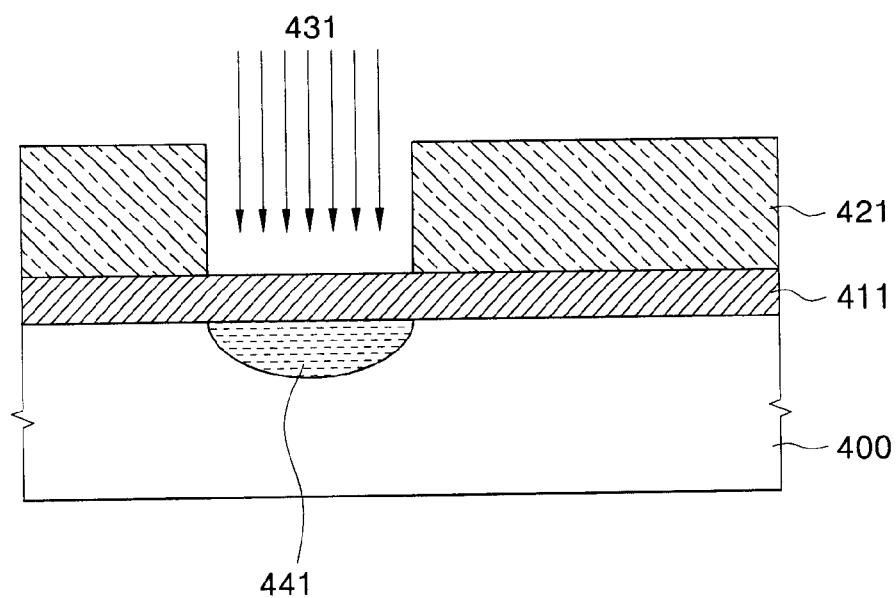

Referring to FIG. 6B, photoresist is applied on the gate insulating film 411 and patterned into a photoresist pattern 421 to expose a portion of the gate insulating film 411 corresponding to the channel region 440 that will be formed in subsequent processes. Using the photoresist pattern 421 as a mask, an $n^+$-type high-density impurity 431 is ion-implanted into the semiconductor substrate 400 to form the $n^+$-type high-density doped region 441. Preferably, a phosphorus ion is implanted at an accelerating voltage of 40 keV to 100 keV and at a dose of $1.0\times10^{13}$ atom/cm$^2$ to $1.0\times10^{14}$ atom/cm$^2$. Thereafter, the photoresist pattern 421 is removed.

Figure 6C:
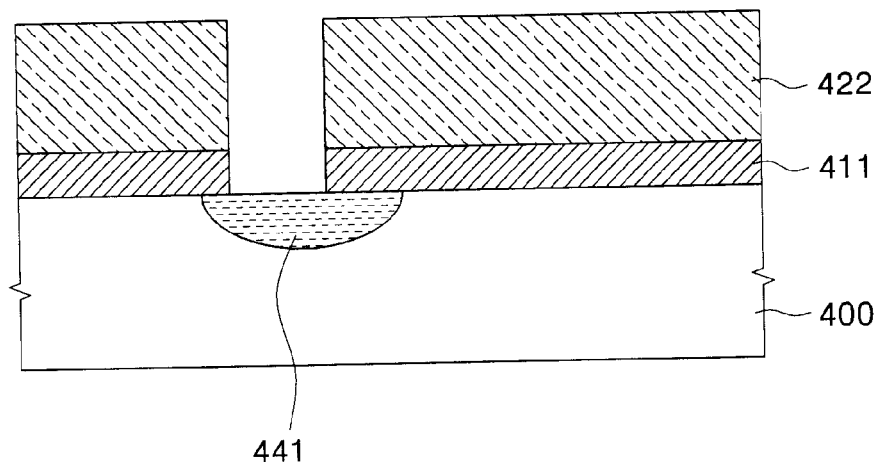

Referring to FIG. 6C, photoresist is applied on the gate insulating film 411 and patterned into a photoresist pattern 422. Using the photoresist pattern 422 as a mask, the gate insulating film 411 is etched to expose a portion of the $n^+$-type high-density doped region 441.

Figure 6D:
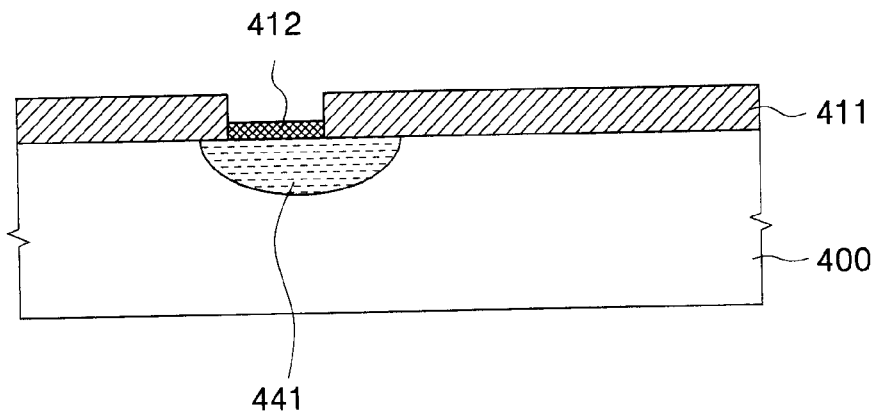

Referring to FIG. 6D, the tunnel insulating film 412 is formed on the exposed portion of the $n^+$-type high-density doped region 441. The tunnel insulating 412 is preferably made of $SiO_2$ or SiON, and has a thickness thinner than the gate insulating film 411 and is preferably 50 Å to 90 Å. Thereafter, the photoresist pattern 422 is removed.

Figure 6E:
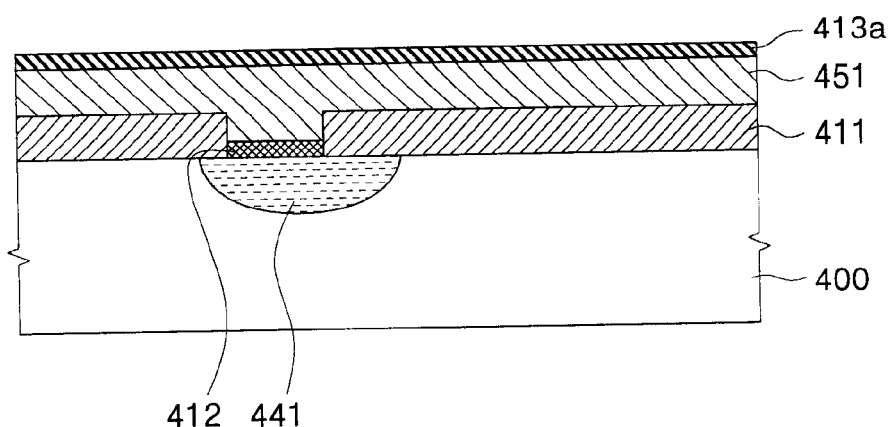

Subsequently, referring to FIG. 6E, a first conductive material layer 451 is deposited over the whole surface of the semiconductor substrate 400. An interlayer insulator 413 is formed on the first conductive material layer 451 in sequence. Preferably, the first conductive material layer 451 is made of polysilicon, and the interlayer insulator 413 is made of $SiO_2$ or O/N/O.

Figure 6F:
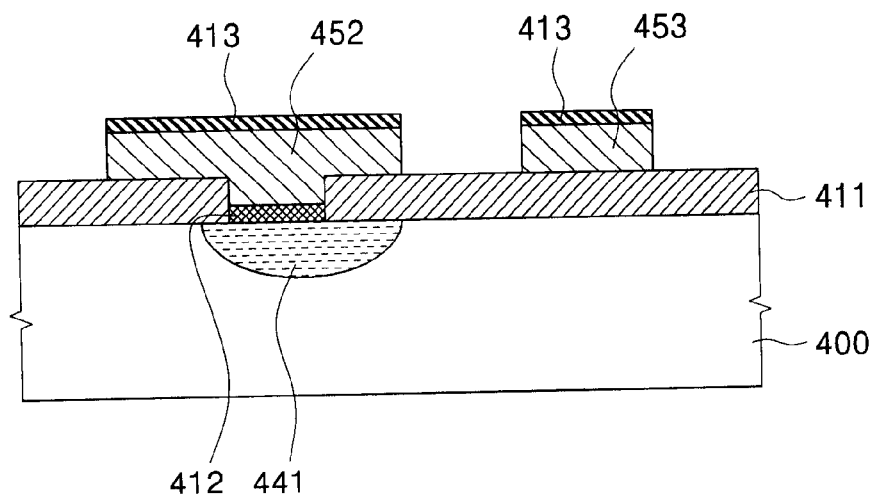

Referring to FIG. 6F, the first conductive material layer 451 and the insulating material layer 413a are simultaneously etched to form the floating gates 452 and 453.

Figure 6G:
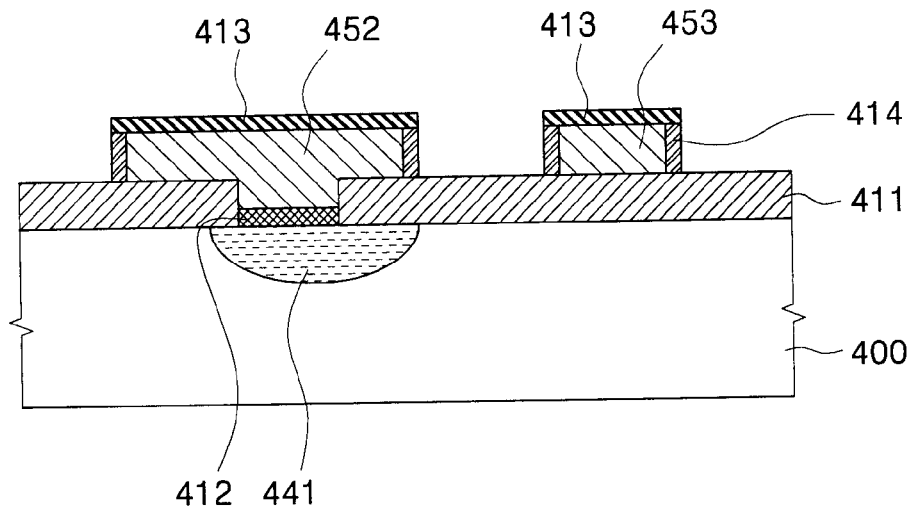

Referring to FIG. 6G, the floating gate 452 and 453 are oxidized through an oxidation process to form the oxide film 414 on both side walls of the gate floating films 452 and 453. Preferably, the oxide film 414 has a thickness of about 300 Å.

Figure 6H:
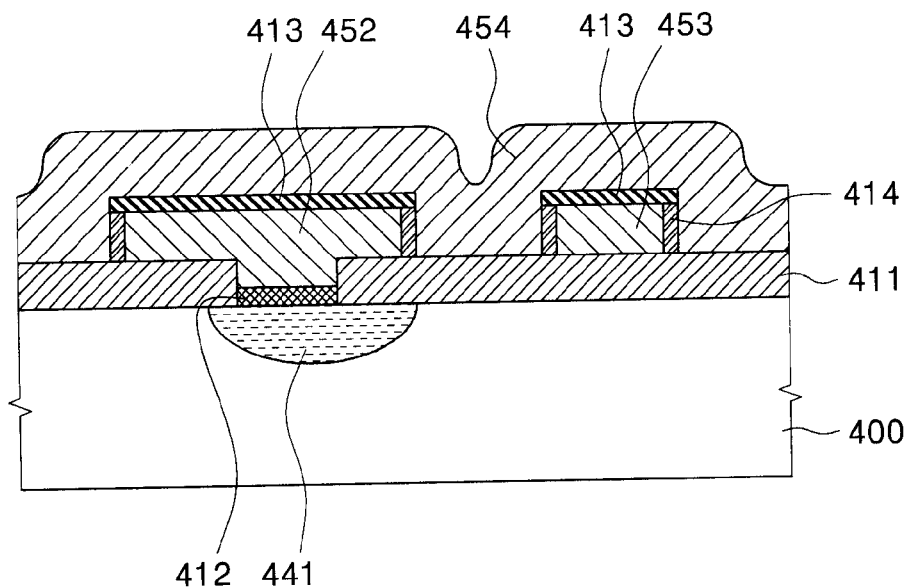

Referring to FIG. 6H, a second conductive material layer 454 is deposited over the whole surface of the semiconductor substrate 400. Preferably, the second conductive material layer 454 is made of polysilicon or polycide.

Figure 6I:
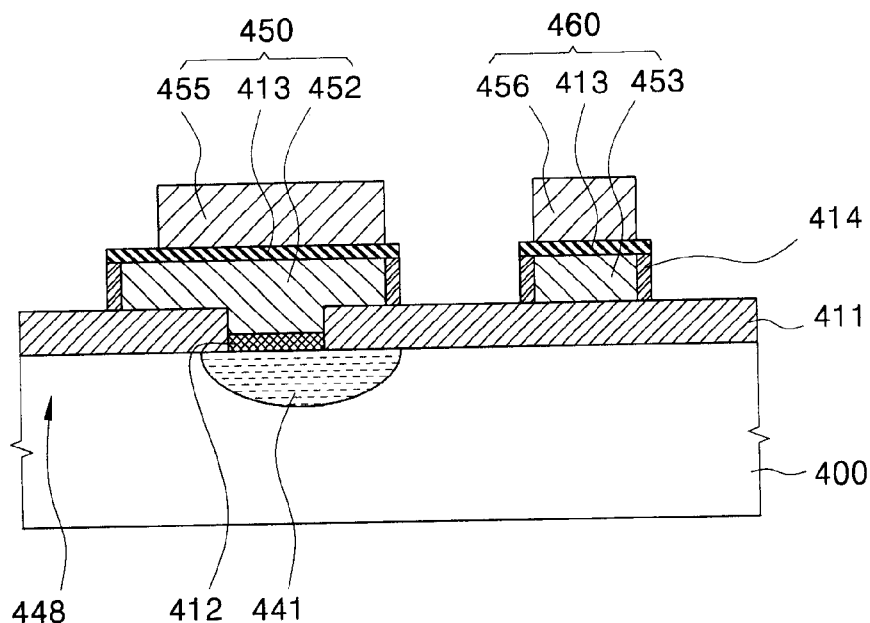

Referring to FIG. 6I, the second conductive material layer 454 is patterned into the sense line 455 and the word line 456. Therefore, the gate 450 of the memory transistor and the gate 460 of the select transistor are completed.

Figure 6J:
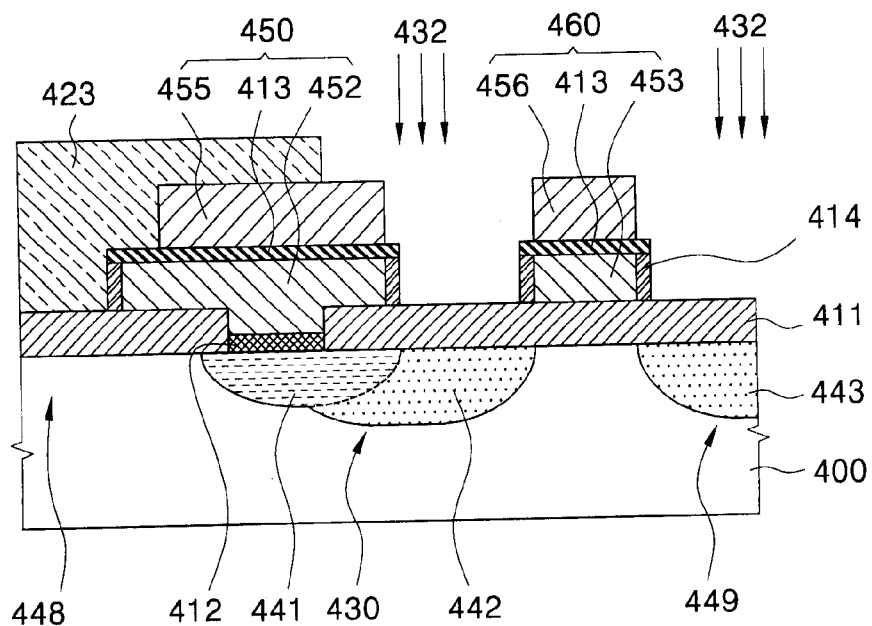

Referring to FIG. 6J, a photoresist pattern 423 is formed to expose portions of the semiconductor substrate 400 in which the channel region and the drain region will be formed. Using the photoresist pattern 423 as a mask, an $n^-$-type low-density impurity 432 is ion-implanted to form the $n^-$-type low density doped regions 442 and 443. Preferably, a phosphorus ion is implanted at an accelerating voltage of 80 keV to 90 keV and at a dose of $1.0\times10^{12}$ atom/cm$^2$ to $5.0\times10^{13}$ atom/cm$^2$. The $n^-$-type low-density doped regions 442 and 443 formed in such an ion-doping condition are called a high voltage $N^-$ ($HVN^-$) junction region. Thereafter, the photoresist pattern 423 is removed.

Figure 6K:
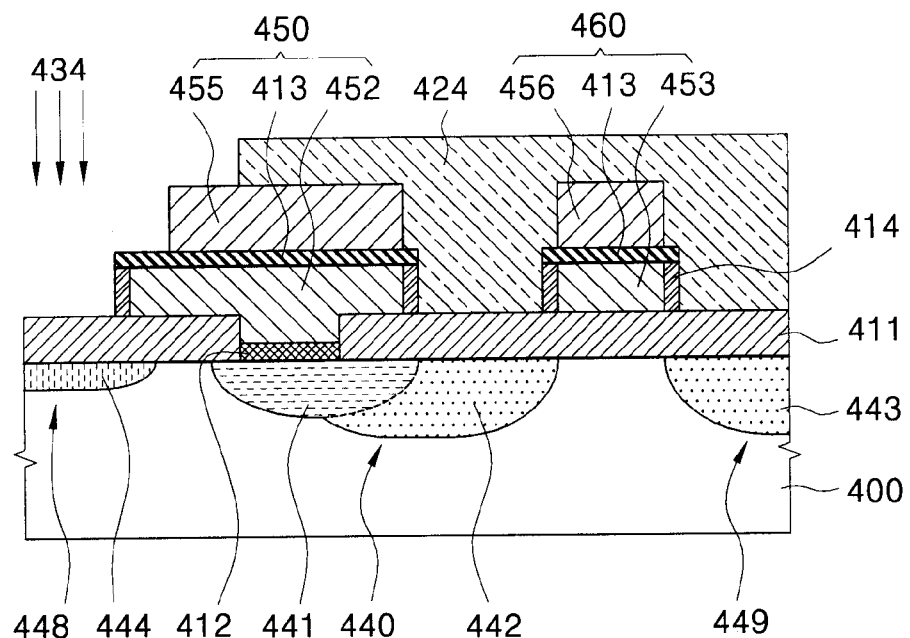

Referring to FIG. 6K, a photoresist pattern 424 is formed to expose a portion of the semiconductor substrate 400 in which the common source region will be formed. Using the photoresist pattern 424 as a mask, an $n^-$-type low-density impurity 434 is ion-implanted to form the $n^-$-type low-density doped region 444. Preferably, a phosphorus ion or an arsenic ion is implanted at an accelerating voltage of 30 keV to 80 keV and at a dose of $1.0\times10^{12}$ atom/cm$^2$ to $1.0\times10^{13}$ atom/cm$^2$. The $n^-$-type low-density doped region 444 formed in such an ion-doping condition is called a low voltage $N^-$ ($LVN^-$) junction region. Thereafter, the photoresist pattern 424 is removed.

As described above, the $LVN^-$ junction region 444 of the common source region 448 is formed in a different ion-doping condition from the $HVN^-$ junction regions 442 and 443. Therefore, the $LVN^-$ junction region 444 of the common source region 448 is shallower in depth than the $HVN^-$ junction regions 442 and 443 and has a relative short side diffusion length, thereby increasing an effective channel length of the memory transistor.

Figure 6L:
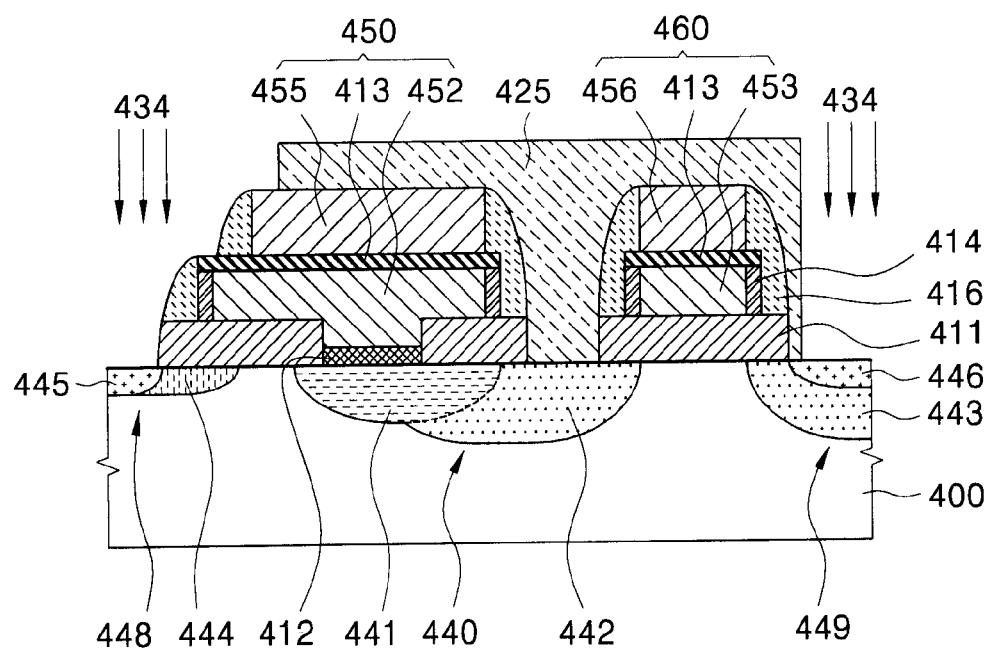

Referring to FIG. 6L, an insulating material layer is deposited over the whole surface of the semiconductor substrate 400 and is anisotropically dry-etched to form the spacers 416 on both side walls of the oxide film 414 and the sense line 455 of the gate 450 of the memory transistor and on both side walls of the oxide film 414 and the word line 456 of the gate 460 of the select transistor.

Thereafter, a photoresist pattern 425 is formed to expose a portion of the $HVN^-$ junction region 443 and a portion of the $LVN^-$ junction region 444. Using the photoresist pattern 425 as a mask, an $n^+$-type high-density impurity 434 is ion-implanted to form the $n^+$-type high-density doped region 445 and the $n^+$-type high-density doped region 446. Preferably, an arsenic ion is implanted at an accelerating voltage of 40 keV to 60 keV and at a dose of $1.0\times10^{15}$ atom/cm$^2$ to $5.0\times10^{13}$ atom/cm$^2$.

The $n^+$-type high-density doped region 445 is formed to abut the $LVN^-$ junction region 444 and forms the common source region 448 of the LDD structure together with the $LVN^-$ junction region 444. The $n^+$-type high-density doped region 446 is formed in a depth shallower than the $HVN^-$ junction region 443 and forms the drain region 449 of the double diffusion structure together with the $HVN^-$ junction region 443.

Thereafter, as shown in FIG. 5, a passivation film 417 is formed over the whole surface of the semiconductor substrate 400. The contact hole 418 is formed to expose a portion of the $n^+$-type high-density doped region 446 of the drain region 449. The bit line 458 is formed to electrically contact the drain region 449. Therefore, the EEPROM cell according to the present invention is completed.

As described above, the $n^+$-type high-density doped regions 445 and 446 are simultaneously formed. However, the $n^+$-type high-density doped regions 445 and 446 can be formed by other methods. For example, the $n^+$-type high-density doped region 455 can be formed using a photoresist pattern that exposes a portion of the $LVN^-$ junction region 444. Thereafter, the passivation film 417 is formed, and the contact hole 418 is formed at a location corresponding to a portion of the HVN⁻ junction region 443. An impurity is ion-implanted through the contact hole 418 to form the n⁺-type high-density doped region 446 of the drain region 449.

In order to manufacture the EEPROM of FIG. 3, during a process of FIG. 6F, the first conductive material layer 451 is etched to form only the floating gate 452 of the gate 450 of the memory transistor. The processes of FIGS. 6G to L are performed in sequence.

As described herein, the EEPROM cell according to the present invention has the following advantages. Since the low-density doped region of the common source region is formed by a separate process from the low-density doped regions of the channel region and the drain region in a depth shallower than the low-density doped regions of the channel region and the drain region, a side diffusion of the common source region can be reduced. Therefore, an effective channel length of the memory transistor is increased without increasing a size of the EEPROM cell, thereby improving threshold voltage distribution, leading to excellent device characteristics.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A non-volatile memory device, comprising:
   gate insulating films formed on a semiconductor substrate and spaced apart from each other;
   a tunnel insulating film formed on the semiconductor substrate and interposed between the adjacent gate insulating films;
   a memory transistor gate formed on the tunnel insulating film and the gate insulating film interposing the tunnel insulating film therebetween;
   a select transistor gate formed on the gate insulating film spaced apart from the memory transistor gate;
   a first doped region formed in a portion of the semiconductor substrate under the memory transistor gate and extending to overlap one end of the select transistor gate;
   a second doped region formed in a portion of the semiconductor substrate spaced apart from the first doped region and overlapping one end of the memory transistor opposite to the select transistor gate; and
   a third doped region formed in a portion of the semiconductor substrate spaced apart from the first doped region and overlapping the other end of the select transistor gate,
   wherein the second doped region has an n⁻ type low-density doped region and an n⁺ type high-density doped region, and is a lightly doped drain (LDD) structure shallower in depth than the first and third doped regions.

2. The device of claim 1, wherein the third doped region has a low-density doped region and a high-density doped region and has a double diffusion structure.

3. The device of claim 1, wherein the memory transistor gate includes a floating gate, an interlayer insulator and a sense line which are stacked in sequence.

4. The device of claim 3, wherein the floating gate includes polysilicon, the interlayer insulator includes at least one of SiO₂ and oxide/nitride/oxide, and the sense line includes at least one of polysilicon and polycide.

5. The device of claim 1, where the select transistor gate includes a floating gate, an interlayer insulator and a word line which are stacked in sequence.

6. The device of claim 5, wherein the floating gate includes polysilicon, the interlayer insulator includes at least one of SiO₂ and oxide/nitride/oxide, and the word line includes at least one of polysilicon and polycide.

7. The device of claim 1, wherein the select transistor gate includes a word line.

8. The device of claim 7, wherein the word line includes at least one of polysilicon and polycide.

9. The device of claim 1, wherein the tunnel insulating film includes at least one of SiO₂ and SiON.

\* \* \* \* \*